United States Patent [19]

Watanabe et al.

[11] Patent Number: 4,845,454

[45] Date of Patent: Jul. 4, 1989

[54] INDUCTANCE ELEMENT WITH CORE OF MAGNETIC THIN FILMS

[75] Inventors: Shigetoshi Watanabe; Takafumi Toda, both of Saitama, Japan

[73] Assignee: Toko, Inc., Japan

[21] Appl. No.: 77,298

[22] Filed: Jul. 24, 1987

[30] Foreign Application Priority Data

| Jul. 29, 1986 | [JP] | Japan | 61-178151 |
| Oct. 1, 1986 | [JP] | Japan | 61-234175 |
| Apr. 24, 1987 | [JP] | Japan | 62-101431 |

[51] Int. Cl.[4] .................................................. H01F 27/24
[52] U.S. Cl. ........................................ 336/212; 336/218; 336/219; 336/234
[58] Field of Search ............... 365/173, 133; 336/200, 336/212, 219, 221, 213, 234, 218, 222

[56] References Cited

U.S. PATENT DOCUMENTS

| 2,984,825 | 5/1961 | Fuller et al. | 365/173 |
| 3,210,707 | 10/1965 | Constantakes | 336/200 |
| 3,213,431 | 10/1965 | Kolk, Jr. et al. | 365/173 X |
| 3,271,718 | 9/1966 | Shaw | 336/219 X |
| 3,305,814 | 2/1967 | Moyer | 336/200 |
| 3,470,550 | 9/1969 | Obeng | 365/173 |
| 3,480,926 | 11/1969 | Oberg | 365/173 X |
| 3,524,173 | 8/1970 | Wolf | 365/173 |
| 3,535,703 | 10/1970 | Rork | 365/173 |
| 3,543,249 | 11/1970 | Bobeck et al. | 365/173 |
| 3,702,239 | 11/1972 | Nagy et al. | 365/173 X |
| 3,798,623 | 3/1974 | Kaske et al. | 365/173 X |
| 3,961,299 | 6/1976 | Lazzari et al. | 336/219 X |
| 4,025,379 | 5/1977 | Whetstone | 336/219 X |

*Primary Examiner*—Thomas J. Kozma

[57] ABSTRACT

An inductance element comprises at least one annular core formed by a magnetic foil belt wound in a volute form and comprising magnetic thin films deposited on a tape-like thin plate; and at least one wire wound on said core. The magnetic thin films are provided with an axis of easy magnetization directed in the direction of width of said magnetic foil belt. Further, the magnetic thin films are thicknesswise separated into a plurality of discrete layers by at least one intervening resistance layer having a resistivity in the range from $10^2 \mu\Omega \cdot cm$ to $10^6 \mu\Omega \cdot cm$. Alternatively, the core may be formed by plural pieces of magnetic foil belt comprising magnetic thin films deposited on a tape-like thin plate, said plurality pieces of magnetic foil belt being insulated from each other and provided in a laminated form.

8 Claims, 4 Drawing Sheets

INDUCTANCE ELEMENT WITH CORE OF MAGNETIC THIN FILMS

BACKGROUND OF THE INVENTION

1. Field of the Invention

This invention relates to an inductance element, and more particularly it pertains to such an inductance element adapted to be used as power transformer or coil for a switching power supply device.

2. Description of the Prior Art

Recently, a switching power supply device has been extensively used with a wide variety of electric equipment and implements. To cope with miniaturization of electric equipment and implements, it has been demanded that the power supply device be made lighter and thinner. Capacitors and coils used in a switching power supply device may be smaller in size for a higher switching frequency, and thus there is a tendency that an extremely high switching frequency is used.

To render coils and transformers operable at a high frequency, it is necessary to use a core material adapted for such a high-frequency application. A bulky core such as ferrite core or the like has conventionally been used with a transformer or coil for a switching power supply device. However, because of the fact that variations in magnetization of the core which occur when the transformer or coil is energized with a driving current, are caused through movement of magnetic domain walls, the core fails to follow a switching frequency as high as about 200 KHz, and thus if it is attempted to effect switching operation at a rate higher than that, power loss is greatly increased so that the transformer or coil using such a core turns out to be inoperative.

SUMMARY OF THE INVENTION

The present invention has been made with a view to eliminating the aforementioned drawbacks of the prior art. It is a primary object of the present invention to provide an inductance element having an improved high-frequency characteristic.

Briefly, according to present invention, there is provided an inductance element which comprises at least one annular core formed by a magnetic foil belt wound in a volute form and comprising magnetic thin films deposited on a tape-like thin plate, and at least one wire wound on said core. The magnetic thin films are provided with an axis of easy magnetization direction in the direction of width of the magnetic foil belt. Alternatively, the core may be formed by plural pieces of magnetic foil belt comprising magnetic thin films deposited on a tape-like thin plate, said plural pieces of magnetic foil belt being insulated from each other and provided in a laminated form. Furthermore, at least one closed magnetic circuit is established by means of one or more cores.

Other objects, features and advantages of the present invention will become apparent from the ensuing description taken in conjunction with the accompanying drawings.

DESCRIPTION OF THE PREFERRED EMBODIMENTS

EXAMPLE 1

Figure 1:
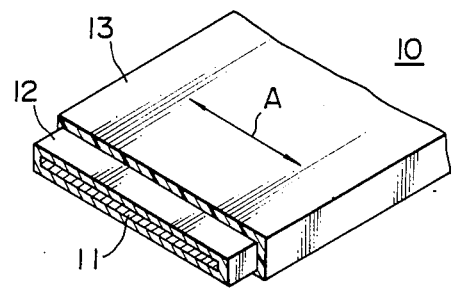
FIG. 1 is a perspective view showing, partly in section, the magnetic foil belt according to an embodiment of the present invention.

Referring to FIG. 1, a magnetic foil belt is shown generally at 10 which is usable to form a core for the inductance element according to the present invention. More specifically, the magnetic foil belt 10 comprises an elongate thin plate 11 of a metal conductor such as copper foil or an insulator; a magnetic thin film 12 of a magnetic material with a high permeability such as permalloy or the like which is uniformly deposited in a thickness of several $\mu$m on the entire surface of the thin plate 11 by means of an electroplating method, a vacuum evaporation process or the like; and an insulation film 13 of epoxy resin or the like coated on the outer surface of the magnetic thin film 12. In an attempt to deposite the magnetic thin film 12 onto the thin plate 11, an axis of easy magnetization of magnetic anisotropy which extends in the direction of width of the thin plate 11, may be provided in the thin film 12 by applying an intense magnetic field thereto. In FIG. 1, the direction of the axis of easy magnetization is indicated by arrow marks A.

The magnetic thin film has such a nature that a magnetization vector directed in the direction of axis of difficult magnetization by applying an external driving magnetic field thereof, is permitted to return to the direction of axis of easy magnetization quickly upon removal of the driving magnetic field. As well known in the art, in the case of a magnetic thin film, magnetization is generated through concerted movement of magnetic spins so that a much higher response speed is realized than in the case of a bulky core such as ferrite core or the like in which magnetization is generated through movement of magnetic domain walls.

Figure 2:
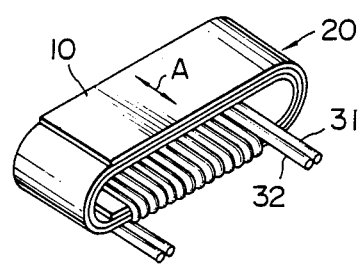
FIG. 2 is a perspective view showing an example of transformer using the magnetic foil belt shown in FIG. 1.
Figure 3:
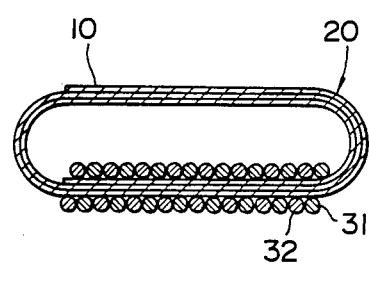
FIG. 3 is a front sectional view of the transformer shown in FIG. 2.

Referring to FIGS. 2 and 3, there is shown an example of inductance element constructed in the form of a transformer using a core 20 formed by the magnetic foil belt 10. The core 20 comprises the magnetic foil belt 10 which is longitudinally wound in a volute form. The transformer is constructed by winding onto part of the core a pair of insulated wires 31 and 32 which are disposed in juxtaposing relationship with each other. Needless to say, it is also possible that the transformer may be constructed by winding single such wire or three or more such wires in a similar manner.

Figure 4:
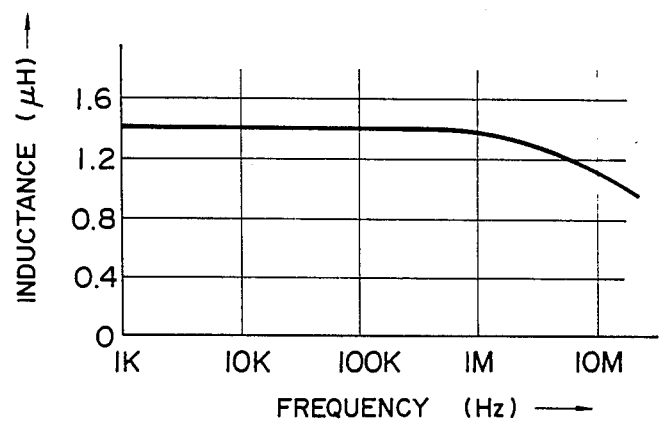
FIG. 4 is a view illustrating the frequency characteristic of the transformer shown in FIG. 2.

FIG. 4 illustrates a result obtained by measuring the frequency characteristic of the transformer shown in FIGS. 2 and 3, and from this figure, it will be seen that the inductance of the transformer remains substantially unchanged at a frequency below 2 MHz; thus, the transformer is operable with a frequency which is about ten (10) times as high as that with which a transformer using a core of a different material such as ferrite or the like is operable.

With a DC-DC converter (input +5 V; output ±12 V; power 5 W) made on an experimental basis by using the aforementioned transformer, a conversion efficiency of 70% has been achieved at the switching frequency of 1.7 MHz which is about ten (10) times as high as the switching frequency that was conventionally used.

Figure 5:
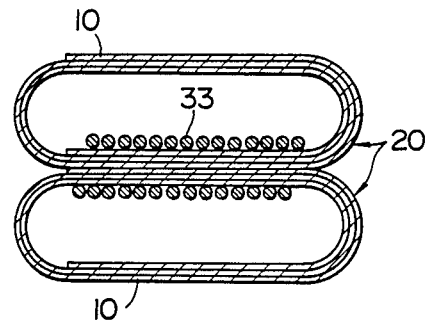
FIG. 5 is a front sectional view showing another example of inductance element.

FIG. 5 shows an example of coil equipped with two cores 20 each formed by using the magnetic foil belt 10, wherein the coil consists of a single wire 33 and is wound on the adjacent portions of the two cores 20, thereby reducing the leakage flux while at the same time increasing the inductance.

As will be appreciated from the above discussion, the inductance element having the above-described construction according to the foregoing embodiment of this invention is permitted to operate with a frequency more than ten times as high as that with which the conventional one was operable, while the function of high power energy conversion is retained.

EXAMPLE 2

Figure 6:
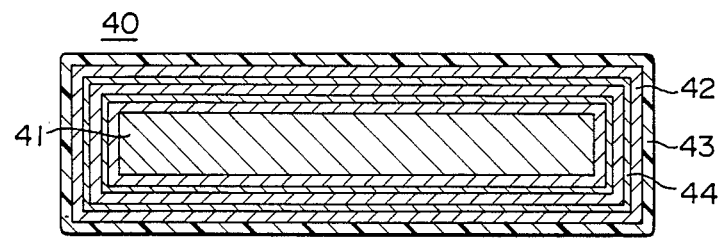
FIG. 6 is an enlarged cross-sectional view showing the magnetic foil belt according to a second embodiment of the present invention.

FIG. 6 is a cross-sectional view showing another example of magnetic foil belt 40 which comprises an elongate thin plate 41 of a metal conductor such as copper foil or an insulator; an alternate arrangement of magnetic thin films 42 and resistance layers 44 of a low resistivity provided on the entire surface of the thin plate 41, the magnetic thin films 42 being formed of a material having a high permeability such as permalloy or the like; and an insulation film 43 of epoxy resin or the like coated on the outer surface of the alternate arrangement of magnetic thin films 42 and resistance layers 44. It is desirable that the resistivity of the resistance layer 44 be selected from the range from $10^2 \mu\Omega cm$ to $10^6 \mu\Omega cm$ so that the electroplating method which is an efficient process can be employed in an attempt to provide the magnetic thin film 42 on the insulation layers 44. If the resistivity of the resistance layers 44 is lower than $10^2 cm$, then electrical separation between the respective magnetic thin films 42 will turn out to be insufficient, whereas if the resistivity of the resistance layers 44 is higher than $10^6 \mu\Omega cm$, then the electroplating method will be unable to be employed.

The resistance layers 44 may be formed of a metallic compound of iron or nickel or the like. More specifically, in the case where the magnetic thin film 42 consists of permalloy, then the resistance layers 44 can be formed by heating to cause the surfaces thereof to be oxidized. Such heating process is advantageous in that thin resistance layers 44 can be easily achieved and the resistivity thereof can be accurately controlled. In practice, the thin plate 41, magnetic thin films 42, and resistance layers 44 may be about 20 $\mu$m, 4000 Å, and 200 Å in thickness, for example, respectively.

Figure 7:
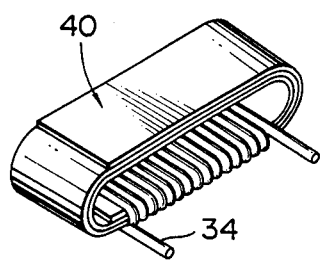
FIG. 7 is a perspective view showing an example of coil using a core formed by the magnetic foil belt shown in FIG. 6.

Referring to FIG. 7, there is shown an example of inductance element using the aforementioned magnetic foil belt 40, which comprises an annular core formed by longitudinally winding in a spiral form the magnetic foil belt 40 such as shown in FIG. 6; and a coil consisting of a wire 34 wound onto the core.

Figure 8:
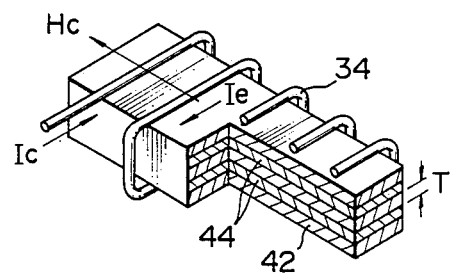
FIG. 8 is a view useful for explaining the operation of the coil shown in FIG. 7.

FIG. 8 is a view useful for explaining the operation of the inductance element shown in FIG. 7 and illustrating a model comprising a core consisting of part of laminated magnetic thin films 42 separated by intervening resistance layers 44; and a wire 34 wound on the core. When a high frequency current Ic flows through the wire 34 constituting the coil, a high frequency magnetic field Hc is caused to occur in the direction of the axis of the core so that an eddy current Ie is caused to flow in the magnetic thin films 42 in such a direction as to counteract the high frequency magnetic field Hc.

On the assumption that the thickness of unit magnetic thin films 42 separated by the resistance layers 44 is T, the resistivity of the magnetic thin films 42 is $\rho$, and the frequency is f, the magnitude of the eddy current Ie which is caused to flow in this case, is given by $$Ie \propto \rho/(Hc \cdot f \cdot T^2)$$

Power consumption Pe which is caused per unit volume when the eddy current Ie flows, is given by $$Pe \propto 92 /(Hc^2 \cdot f^2 \ T^3)$$

It will be noted that both the eddy current Ie and power consumption Pe depend largely upon the thickness of the magnetic thin films 42. Thus, to improve the high frequency characteristic of the coil, the eddy current Ie and power consumption Pe should be minimized, and to this end, the thickness T of the magnetic thin films 42 separated by the resistance layers 44 should be reduced.

Figure 9:
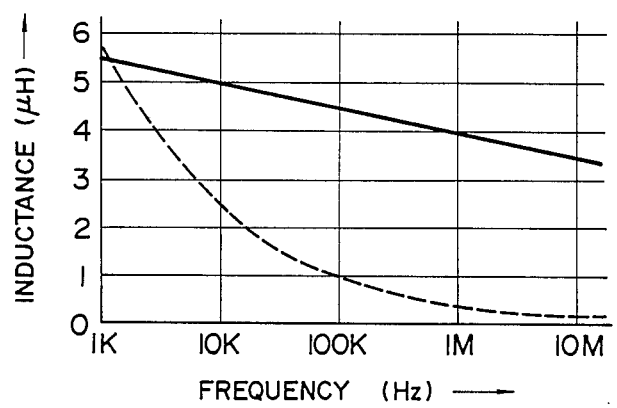
FIG. 9 illustrates the frequency characteristic of the coil shown in FIG. 7.

FIG. 9 illustrates the frequency versus inductance characteristic of the coil constructed as shown in FIG. 7, wherein the solid curve indicates the characteristic which occurs when the coil includes seven magnetic thin films separated by resistance layers, and the dotted curve shows the characteristic which occurs when the coil includes a single magnetic thin film, with no resistance layer being provided. As will be noted, the inductance with the coil including the single magnetic thin film, the inductance thereof drops abruptly at 1 KHz; and at about 40 KHz, it becomes lower than 20% of that that occurred at 1 KHz. In contrast thereto, with the coil including the resistance layers, even at 2 MHz, the inductance thereof drops only down to 70% of that that occurs at 1 KHz; and reduction in the inductance which occurs in the high frequency region, is extremely small.

With the foregoing construction, the magnetic thin films can be provided in a laminated form and the entire thickness thereof can be reduced; in addition, the respective thin films are separated by resistance layers, and thus, power loss due to eddy current can be greatly reduced. In this way, according to the present invention, there is provided a miniaturized inductance element with an excellent high frequency characteristic.

According to this invention, since the magnetic thin films are separated from each other by intervening resistance layers which are electrically conductive as mentioned above, it is possible to employ the electroplating method for the purpose of causing the magnetic thin films to be deposited onto the conductive thin plate and resistance layers. The resistance layers provided on the magnetic thin films can be easily formed simply by heating to cause the surfaces of the magnetic thin films to be oxidized. Thus, according to the present invention, even a composite structure wherein magnetic thin films are deposited in the form of multi-layers, can be produced quickly and efficiently by means of a continuous plating process.

EXAMPLE 3

Figure 10:
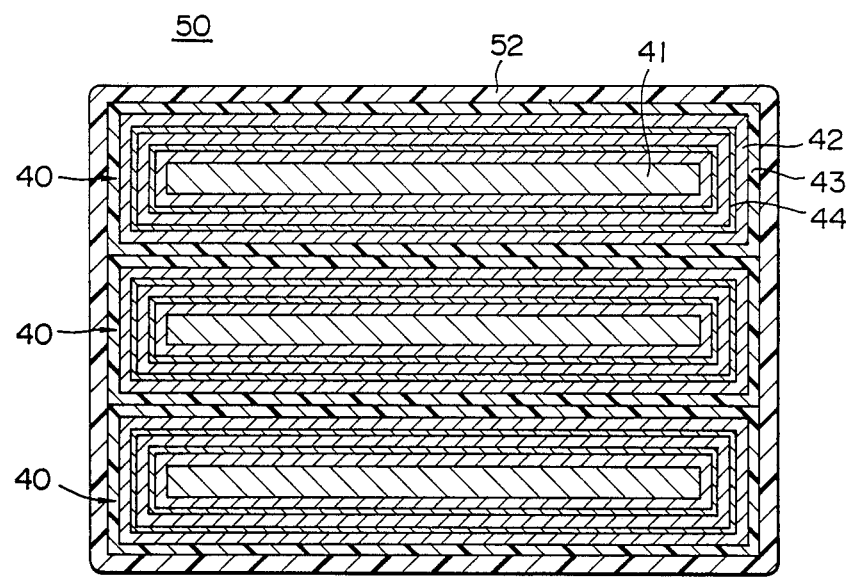
FIG. 10 is an enlarged cross-sectional view showing another example of core for inductance element.

Referring to FIG. 10, another example of core is shown generally at 50, which comprises plural pieces of magnetic foil belt 40 such as shown in FIG. 6, which are provided in a laminated form and adhered to each other and encapsulated with a plastic film 52.

Figure 11:
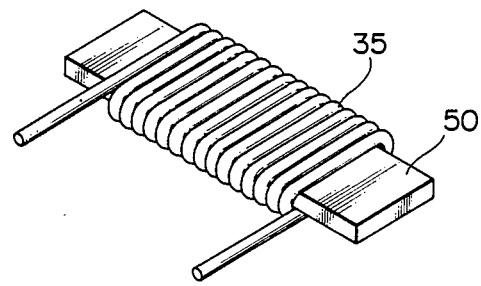
FIG. 11 is a perspective view showing an example of coil using the core shown in FIG. 10.

FIG. 11 shows an example of coil which is constructed by using the core 50 comprising a plurality of magnetic thin films provided in a laminated form as mentioned above. More specifically, the coil comprises the core 50 whihc is configured in a belt-like form of a predetermined length; and a wire 35 wound on the core 50, the wire being coated with a film of insulating material such as polyurethane or the like.

Figure 12:
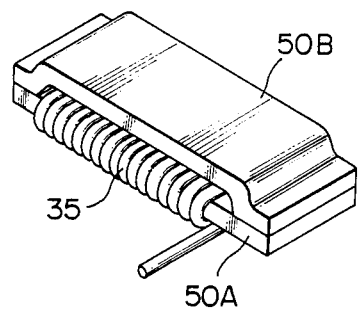
FIG. 12 is a perspective view showing another example of coil using the core shown in FIG. 10.
Figure 13:
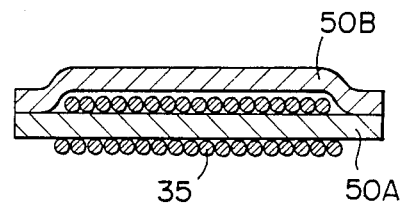
FIG. 13 is a front sectional view of the coil shown in FIG. 12.

FIGS. 12 and 13 show a further example of coil which comprises a pair of cores 50A and 50B formed by cutting the belt-like core 50 to pieces of a predetermined length; and a wire 35 coated with an insulating film and wound on one of the cores, 50A. The other core 50B is disposed on the coil in superimposing relationship therewith, and the pair of cores 50A and 50B have their opposite end portions adhered to each other. With such construction, the core 50B is made to work as yoke, and a closed magnetic circuit is defined by the cores 50A and 50B, so that flux leakage is decreased; noise is reduced; and an increased inductance is achieved.

Figure 14:
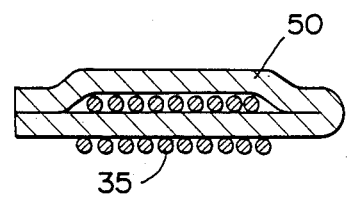
FIGS. 14 and 15 are front sectional views showing other examples of inductance element using the core shown in FIG. 10.

It is also possible that as shown in FIG. 14, the closed magnetic circuit may be formed by a single core 10 which is folded, instead of by two separate cores.

Figure 15:
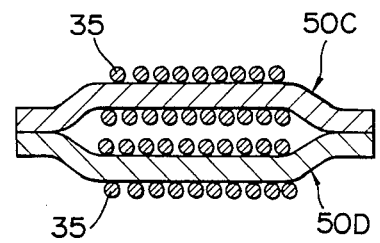

FIG. 15 shows a still further example of coil, which comprises a pair of cores 50C and 50D, wherein a wire 35 is wound onto each of the cores which in turn are jointed at the opposite ends so that a closed magnetic circuit is formed.

The thin plate 12, magnetic thin film 13, and insulation film 14 are 20 $\mu$m, 3 $\mu$m, and 2 $\mu$m in thickness respectively, and the core 50 is about 5 mm in width. Thus, when thirty (30) pieces of such magnetic foil belt 10, 40 are provided in a laminated form, for example, the thickness of the core 50 turns out to be just as small as about 1 mm. In the drawing, the core is shown as comprising only three (3) pieces of magnetic foil belt just for the sake of convenience in illustration, but in practice, it is desirable to use several ten pieces of such magnetic foil belt which are provided in a laminated form.

Figure 16:
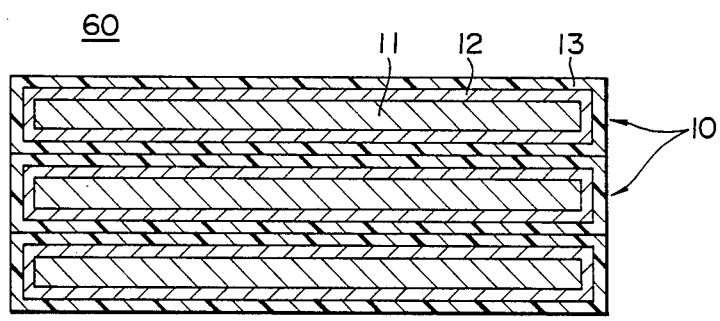
FIG. 16 is an enlarged cross-sectional view showing a still further example of core.

It is also possible that the core 50 may be replaced with a core 60 such as shown in FIG. 16, wherein several pieces of magnetic foil belt 10 such as shown in FIG. 1 which are provided in a laminated form and fixed together, are used instead of the magnetic foil belt 40.

The transformer embodying the present invention may be constructed by winding two or more wires onto a core, as mentioned above with respect to the coil.

As will be appreciated from the above discussion, according to the present invention, it is possible to provide an inductance element which is operable with a still higher frequency, by using a core comprising plural pieces of magnetic foil belt containing magnetic thin films and provided in a laminated form.

While the present invention has been illustrated and described with respect to some specific embodiments, it is to be understood that the present invention is by no means limited thereto but encompasses all changes and modifications which will become possible within the scope of the appended claims.

We claim:

1. An inductance element comprising a core formed by at least one magnetic foil belt consisting of an alternate arrangement, provided on a surface of a tape-like thin plate, of magnetic thin films of permalloy and resistance layers formed by oxidizing the surfaces of said magnetic thin films and having a resistivity in the range from $10^2$ $\mu\Omega$cm to $10^6 \mu\Omega$cm; and a wire wound on said core, said magnetic thin films being provided with an axis of easy magnetization directed in the direction of width of said magnetic foil belt.

2. An inductance element according to claim 1, wherein a closed magnetic circuit is formed by said core.

3. An inductance element according to claim 1, wherein the core is formed in an annular shape with the magnetic foil belt being wound in a spiral form.

4. An inductance element comprising a core formed by at least one magnetic foil belt consisting of an alternate arrangement, provided on a surface of a tape-like thin plate, of magnetic thin films of permalloy and resistance layers formed by oxidizing the surfaces of said magnetic thin films and having a resistivity in the range from $10^2\mu\Omega$cm to $10^6\mu\Omega$cm wherein the core is formed in a belt-like form with plural pieces of the magnetic foil belt insulated from each other and provided in a laminated form, and a wire is wound on the core.

5. An inductance element according to claim 4, wherein a closed magnetic circuit is formed by said core.

6. An inductance element according to claim 5, wherein a second core is provided, and closed magnetic circuit is established with the two cores being joined together at the opposite ends thereof.

7. An inductance element according to claim 5, wherein said closed magnetic circuit is established with the single core being folded.

8. An inductance element according to claim 5, wherein a second core is provided; the closed magnetic circuit is established with the two cores being joined together at the opposite ends thereof; and the wire is wound on each of the cores.

* * * * *